(12) United States Patent
Chappell et al.

(10) Patent No.: US 9,402,330 B2
(45) Date of Patent: Jul. 26, 2016

(54) HALF-RACK CROSSBAR SYSTEMS

(71) Applicant: Atlas Sound LP, Ennis, TX (US)

(72) Inventors: Kenneth Wade Chappell, Midlothian, TX (US); Kevin Sykes, Phoenix, AZ (US)

(73) Assignee: Atlas Sound LP, Ennis, TX (US)

( * ) Notice: Subject to any disclaimer, the term of this patent is extended or adjusted under 35 U.S.C. 154(b) by 333 days.

(21) Appl. No.: 13/936,165

(22) Filed: Jul. 6, 2013

(65) Prior Publication Data

US 2015/0008198 A1 Jan. 8, 2015

(51) Int. Cl.
*H05K 7/18* (2006.01)

(52) U.S. Cl.
CPC ........................... *H05K 7/183* (2013.01)

(58) Field of Classification Search
CPC .............. H02B 1/30; H02B 1/32; H02B 1/34; H05K 7/14; H05K 7/1401; H05K 7/1485; H05K 7/1487; H05K 7/1488; H05K 7/1489; H05K 7/1491; H05K 7/18; H05K 7/183; H05K 7/186
USPC ......... 211/26, 183, 191, 204; 248/127, 163.1, 248/218.4, 220.31; 361/679.31, 724, 825, 361/826
See application file for complete search history.

(56) References Cited

U.S. PATENT DOCUMENTS

| | | | | |
|---|---|---|---|---|
| 2,881,924 A * | 4/1959 | Kruse et al. | | 211/26 |
| 4,106,630 A * | 8/1978 | Rosenband | | 211/191 |
| 4,470,102 A * | 9/1984 | De Luca et al. | | 361/826 |
| 4,757,967 A * | 7/1988 | Delmore et al. | | 248/218.4 |
| 5,330,137 A * | 7/1994 | Oliva | | 248/27.1 |
| 5,386,959 A * | 2/1995 | Laughlin et al. | | 248/205.1 |
| 5,405,111 A * | 4/1995 | Medlin, Jr. | | 248/205.1 |
| 5,542,549 A * | 8/1996 | Siemon et al. | | 211/26 |
| 5,931,425 A * | 8/1999 | Oliva | | 248/200.1 |
| 6,170,673 B1 * | 1/2001 | Nicolai | | 211/26 |
| 6,181,549 B1 | 1/2001 | Mills et al. | | |
| 6,450,350 B1 * | 9/2002 | Krummell, Jr. | | 211/191 |
| 6,484,979 B1 * | 11/2002 | Medlin, Jr. | | 248/205.1 |
| 6,519,791 B2 * | 2/2003 | Randolph | | 4/695 |
| 6,666,340 B2 | 12/2003 | Basinger et al. | | |
| 7,431,610 B2 * | 10/2008 | Laursen | | 439/501 |
| 7,687,716 B2 * | 3/2010 | Pepe et al. | | 174/101 |

(Continued)

FOREIGN PATENT DOCUMENTS

| | | | | |
|---|---|---|---|---|
| DE | 1191454 B * | 4/1959 | | H02B 1/30 |
| FR | 2738102 A1 * | 2/1997 | | H05K 7/14 |

*Primary Examiner* — Joshua Rodden
(74) *Attorney, Agent, or Firm* — Keith L. Jenkins, Registerd Patent Attorney, LLC; Keith L. Jenkins

(57) ABSTRACT

Crossbars span the width between two opposed vertical attachment bars in a half-width electronics rack or cabinet of accommodating height to enable vertical mounting of full-width electronics module in the half-width electronics rack or cabinet. The crossbars are used in opposed spaced-apart pairs with the full-width electronics module mounted vertically between the crossbars. Each crossbar includes a flat elongated main bar having five sets of three holes in a linear array, with the holes sized and spaced apart in accordance with industry standards for electronics racks. An attachment flange with a fastener opening extends from each end of the main bar and is delineated from the main bar by a notch. Between the notches, the same edge extends in a right-angle bend which further extends into a flange. Crossbars are provided in pairs, with or without packaging, racks, cabinets, and electronics modules.

20 Claims, 8 Drawing Sheets

(56) References Cited

U.S. PATENT DOCUMENTS

| | | | |
|---|---|---|---|
| 8,062,049 B2* | 11/2011 | Tobey | 439/345 |
| 8,403,277 B2* | 3/2013 | Nuernberger et al. | 248/200.1 |
| D702,826 S * | 4/2014 | Schluter et al. | D23/370 |
| 2004/0229501 A1* | 11/2004 | Caveney et al. | 439/540.1 |
| 2005/0159036 A1* | 7/2005 | Caveney et al. | 439/188 |
| 2006/0180725 A1* | 8/2006 | Weech et al. | 248/220.21 |
| 2008/0115956 A1* | 5/2008 | Fransen et al. | 174/66 |
| 2013/0091689 A1* | 4/2013 | Mimlitch et al. | 29/525.01 |
| 2013/0213907 A1* | 8/2013 | Masse et al. | 211/26 |
| 2014/0153169 A1* | 6/2014 | Kohonen et al. | 361/679.01 |

\* cited by examiner

HALF-RACK CROSSBAR SYSTEMS

TECHNICAL FIELD

This invention relates to providing cross bars for an electronic module-mounting cabinet (hereinafter "cabinet") for installing electronic modules, or components, that accommodates modules that are half the width of traditional full-rack modules, so as to enable mounting full-rack modules in a half-rack cabinet.

BACKGROUND

Many electronic applications can be created with combinations of electronic modules connected together, and it is convenient to have all the modules for a particular purpose supported in a single structure. A common example is a household stereo component system, which might include a radio receiver, various media players, content storage, and an amplifier. A more modern example would be a server farm. Electronic modules conventionally have signal and power couplings on the rear wall, or "back plane" of the module and controls and visual displays on the front wall, or "front plane", of the module.

The basic structure for supporting a plurality of electronic modules is a rack. Racks come in a variety of standard sizes to accommodate correspondingly-sized electronic modules. The standard sizes for racks and components are established by various industry organizations. A rack with side, top, and rear panels is referred to as a cabinet. As the size of electronic devices has shrunk, smaller modules and racks have entered the market. In particular, half-racks, which are half-width racks as compared to an established standard for racks, are of concern in this application. "Half-rack", as used and defined herein, means a half-width rack or cabinet. "Tall half-rack", as used and defined herein, means a half-width rack or cabinet that is tall enough to accommodate a vertically mounted full-rack module. "Full-rack" as used and defined herein, means a full width rack (i.e., a nineteen inch rack) or cabinet that can support full-width modules horizontally.

Recurring challenges in half-rack technology are to provide a compact package which still provides full functionality.

Therefore, a need exists for a half-rack cabinet that provides for mixing half-rack modules and full rack modules in the same half-rack.

OBJECTS AND FEATURES OF THE INVENTION

A primary object and feature of the present invention is to overcome the above-mentioned problems and fulfill the above-mentioned needs.

Another object and feature of the present invention is to provide half-rack cabinet that provides for mixing half-rack modules and full rack modules in the same half-rack cabinet. Another object of the invention is to provide crossbars that can be installed in a tall half-rack cabinet to provide support for vertically mounting full rack modules in a half-rack cabinet.

It is an additional primary object and feature of the present invention to provide such a system that is efficient, inexpensive and handy. Other objects and features of this invention will become apparent with reference to the following descriptions.

SUMMARY OF THE INVENTION

A pair of crossbars equipped with attachment points for attaching between legacy standardized vertical attachment bars in half-rack-width electronic racks and cabinets to enable the vertical mounting of full-width racks in the half-rack-width cabinet. Each crossbar has a linear array of holes sized and spaced apart according to industry standards for receiving fasteners for fastening full racks to the cross bars. Each crossbar has an attachment extension at each end having a hole for receiving a fastener. Each attachment flange is bounded between an outer edge of a notch and an outer end of the flange. A portion of the crossbar between the notches is bent at a right angle to the main bar. A pair of crossbars may be sold as an aftermarket kit for any half-rack that is tall enough to accommodate vertically mounted full-rack modules. In another embodiment, a pair of crossbars may be sold as a kit with a tall half-rack. In yet another embodiment, a pair of crossbars may be sold as a kit with a tall half-rack with some half-width modules installed. In still yet another embodiment, a pair of crossbars may be sold as a kit with a tall half-rack with at least one half-width module and at least one full-width module installed. In an additional embodiment, a pair of crossbars may be sold as a kit with a tall half-rack with at least one full-width module installed.

BRIEF DESCRIPTION OF THE DRAWINGS

The present invention will hereinafter be described in conjunction with the following drawing figures, wherein like numerals denote like elements.

DETAILED DESCRIPTION OF THE PRESENT INVENTION

Words of orientation, such as right, left, top, bottom, front, rear, etc., as used herein, are based on the device being in operational orientation and seen from the point of view of a person looking at the device from the front.

Figure 1:
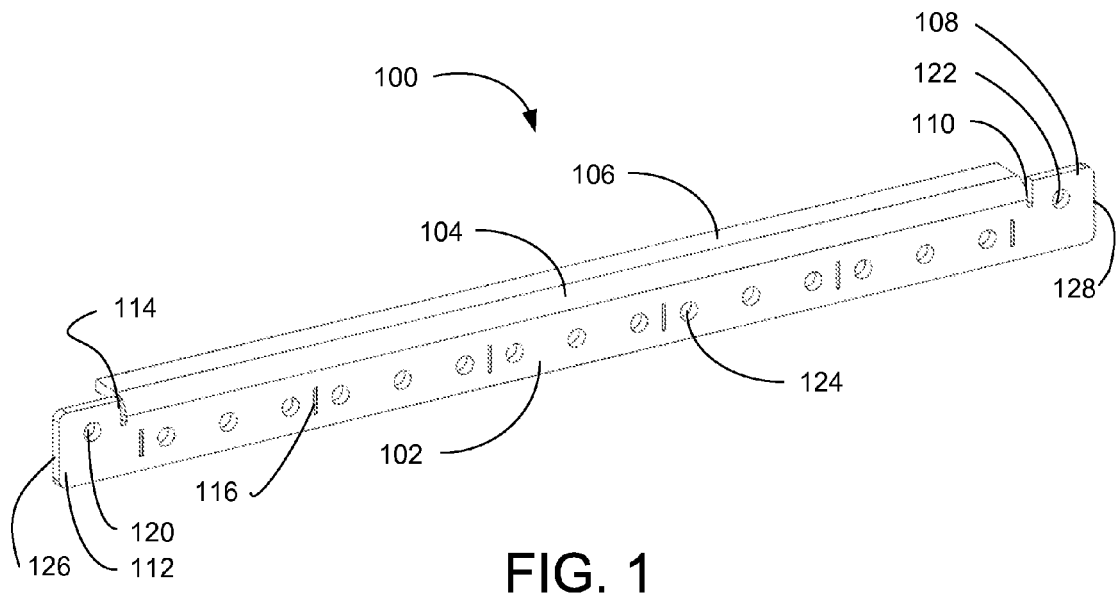
FIG. 1 is a top front perspective view illustrating a first exemplary embodiment of a crossbar of the exemplary half-rack crossbar system, according to a preferred embodiment of the present invention.

FIG. 1 is a top front perspective view illustrating a first exemplary embodiment of a crossbar 100 of the exemplary half-rack crossbar system 400 (see FIG. 4), 500 (see FIG. 5), 600 (see FIG. 6), 700 (see FIG. 7), 800 (see FIG. 8), 900 (see FIG. 9), and 1000 (see FIG. 10), according to a preferred embodiment of the present invention. Crossbar 100 is equipped with attachment extensions 108 and 112 for attaching between legacy standardized vertical attachment bars 504 and 506 (see FIG. 5) in half-rack-width electronic racks and cabinets 502 to enable the vertical mounting of full-width modules 802 and 804 (see FIG. 8) in the half-rack cabinet 502. Each attachment extension 108 and 112 has a hole 122 and 120, respectively, for receiving a fastener for fastening to the legacy standardized vertical attachment bars 504 and 506 (see FIG. 5). Each attachment extension 108 and 112 is bounded between an outer edge of a notch 110 and 114, respectively, and an outer end 128 and 126, respectively, of each extension 108 and 112. Preferably, the outer edge of each notch 110 and 114 aligns to the inner edges of vertical attachment bars 504 and 506 (see FIG. 5), respectively. A flange portion 106 of each crossbar 100 between the notches 110 and 114 is 104 bent at a right angle to the main bar 102. Each crossbar 100 has a linear array of fifteen holes 124 (one of fifteen labeled) in main bar 102 sized and spaced apart according to industry standards for receiving fasteners for fastening full racks 802 and 804 (see FIG. 8) to the cross bars 100. The holes 124 are arranged in five groups of three delineated by six grooves 116. Crossbars 100 are preferably made of metal, more preferably of steel. Crossbars 100 are made from a single piece of material. Two crossbars 100 are used together in a spaced apart arrangement with the flange 106 of each extending rearward into the tall half-rack 502.

Figure 2:
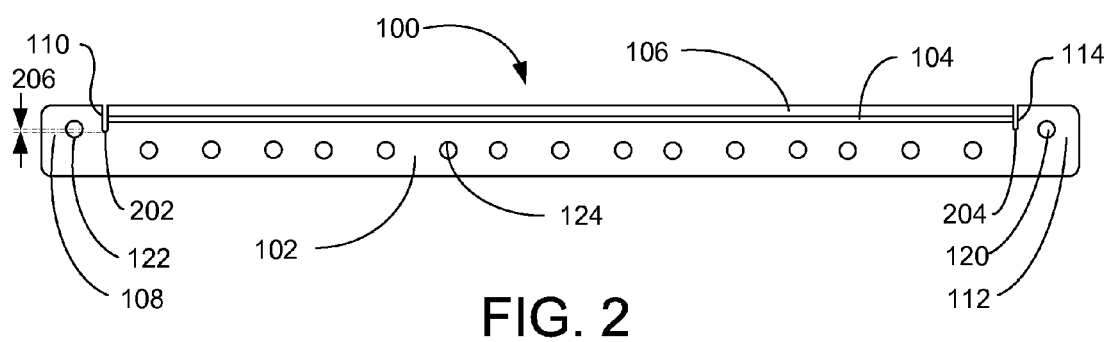
FIG. 2 is a rear elevation view illustrating the first exemplary embodiment of a crossbar of the exemplary half-rack crossbar system of FIG. 1, according to a preferred embodiment of the present invention.

FIG. 2 is a rear elevation view illustrating the first exemplary embodiment of a crossbar 100 of the exemplary half-rack crossbar system 400 (see FIG. 4), 500 (see FIG. 5), 600 (see FIG. 6), 700 (see FIG. 7), 800 (see FIG. 8), 900 (see FIG. 9), and 1000 (see FIG. 10), according to a preferred embodiment of the present invention. Notches 110 and 114 can be more clearly seen in this view. Notches 110 and 114 extend inwardly from a top edge of the main bar 102. The bottoms 202 and 204 of notches 110 and 114, respectively, extend beyond the bent portion 104 of flange 106. The bottoms 202 and 204 of notches 110 and 114, respectively, also extend inwardly beyond the centers of attachment extension holes 122 and 120, respectively, by a distance 206, but do not extend beyond the bottom edges of attachment extension holes 122 and 120, respectively.

Figure 3:
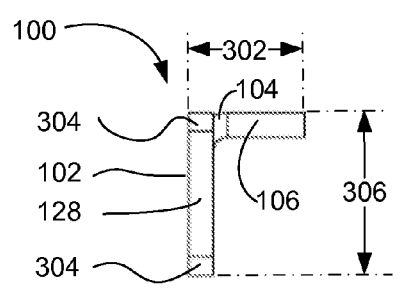
FIG. 3 is an end elevation view illustrating the first exemplary embodiment of a crossbar of the half-rack crossbar system of FIG. 1, according to a preferred embodiment of the present invention.

FIG. 3 is an end elevation view illustrating the first exemplary embodiment of a crossbar 100 of the half-rack crossbar system 400 (see FIG. 4), 500 (see FIG. 5), 600 (see FIG. 6), 700 (see FIG. 7), 800 (see FIG. 8), 900 (see FIG. 9), and 1000 (see FIG. 10), according to a preferred embodiment of the present invention. The size ratio between the rearward extension 302 of flange 106 and the height 306 of the main bar 102 is clearly seen in this view. Preferably, the ratio of rearward extension of flange 106 to main bar 102 height 306 is larger than one-half and more preferably is 0.53. Outer edge 128 of attachment extension 108 has bevels 304.

Figure 4:
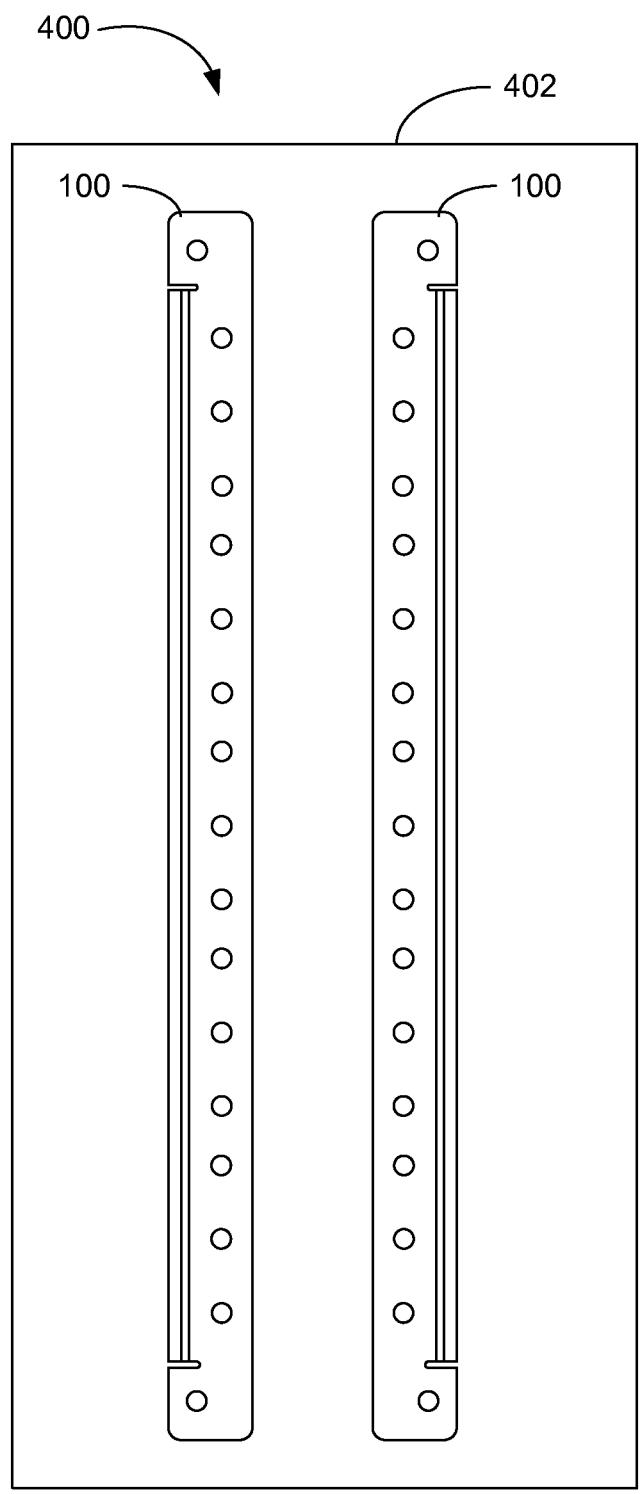
FIG. 4 is a front elevation diagrammatic view illustrating a first exemplary embodiment of the half-rack crossbar system, according to a preferred embodiment of the present invention.

FIG. 4 is a front elevation diagrammatic view illustrating a first exemplary embodiment of the half-rack crossbar system 400, according to a preferred embodiment of the present invention. Half-rack crossbar system 400 is a kit that includes two crossbars 100 in a package 402. The kit is an aftermarket accessory for customers who have tall half-racks 502 and wish to accommodate full-width modules 802 and 804 in the tall half-rack 502. Package 402 may be any type of packaging 402. For non-limiting examples, a bubble pack, a box, a bag, and a piece of adhesive tape binding first and second crossbars 100 together would serve as package 402.

Figure 5:
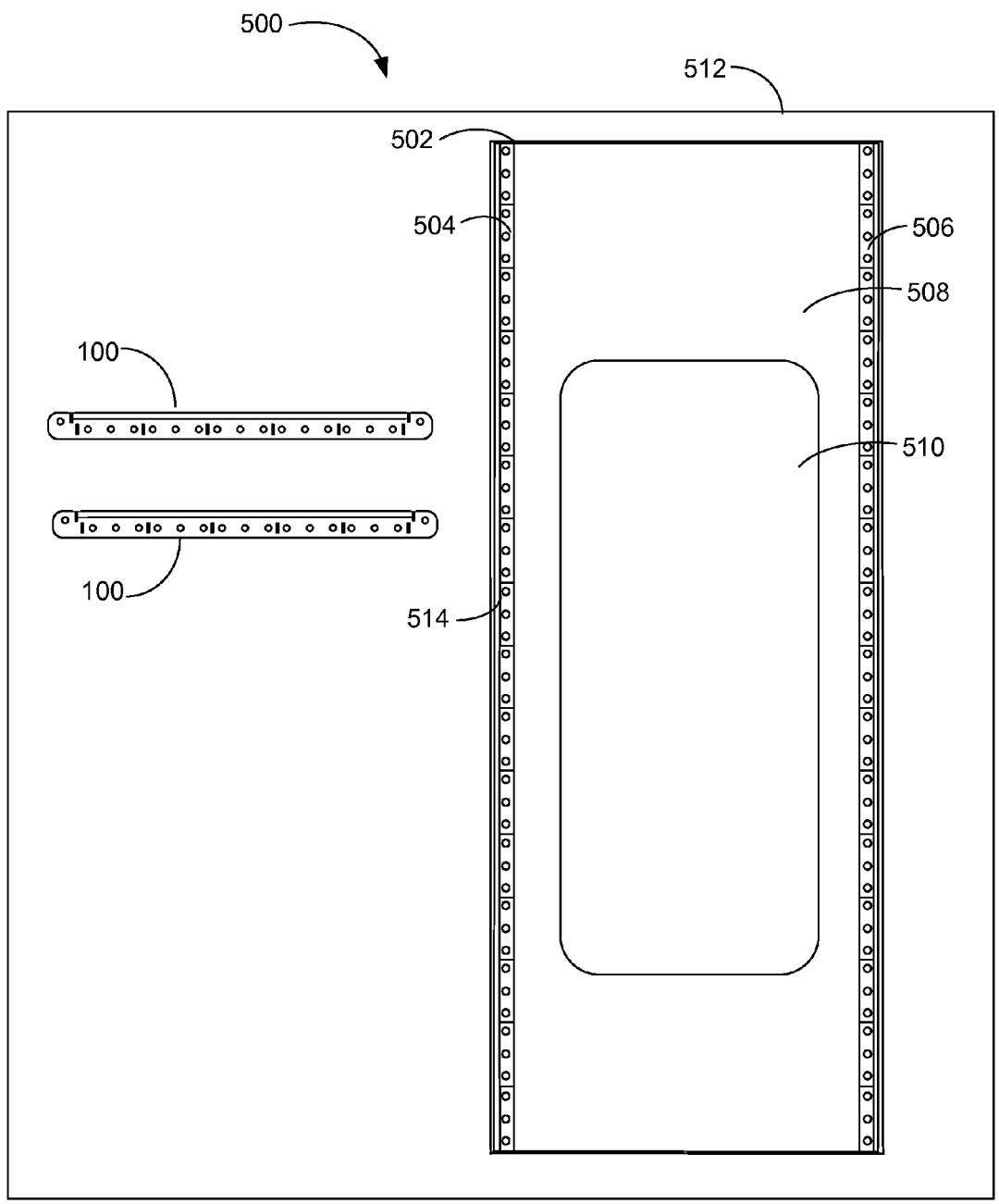
FIG. 5 is a front elevation diagrammatic view illustrating a second exemplary embodiment of the half-rack crossbar system, according to a preferred embodiment of the present invention.

FIG. 5 is a front elevation diagrammatic view illustrating a second exemplary embodiment of the half-rack crossbar system 500, according to a preferred embodiment of the present invention. Package 512 contains exemplary tall half-rack 502 and two crossbars 100. Crossbars 100 are shown in front elevation view. Tall half-rack 502 has first and second vertical attachment bars 504 and 506, a back panel 508, and an opening 510 in the back panel 508. Additional features of the tall half-rack 502 have been omitted for clarity of the drawing. First and second vertical attachment bars 504 and 506 have holes 514 arranged in groups of three separated by groves. The spacing of holes 514 in the first and second vertical attachment bars 504 and 506 is the same as the spacing of holes 124 in crossbar 100. Package 512 may be any type of packaging. For non-limiting examples, a box, a bag, a shrink wrap, or an adhesive tape securing crossbars 100 to tall half-rack 502, may serve as package 512.

Figure 6:
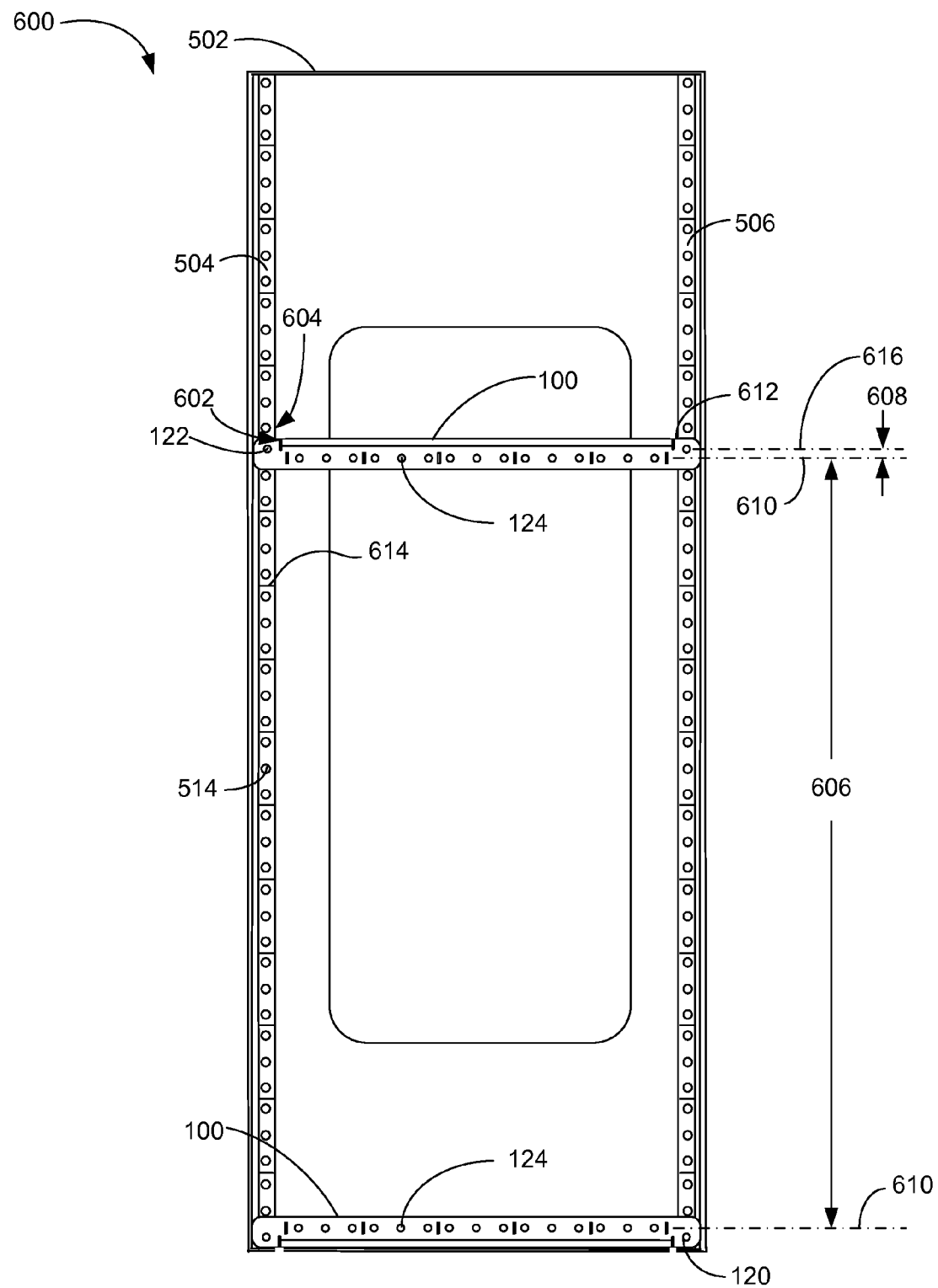
FIG. 6 is a front elevation diagrammatic view illustrating a third exemplary embodiment of the half-rack crossbar system, according to a preferred embodiment of the present invention.

FIG. 6 is a front elevation diagrammatic view illustrating a third exemplary embodiment of the half-rack crossbar system 600, according to a preferred embodiment of the present invention. Tall half-rack 502 has first and second crossbars 100 installed using fasteners through attachment extension fastener holes 120 and 122 (one each of two each labeled). The centerlines 610 of holes 124 in first and second crossbars 100 are spaced apart 606 to receive full-rack width modules 802 and 804 (See FIG. 8). The outer edge 602 of notch 114 is aligned just interior (referenced to the tall half-rack 502) to edge 604 of vertical attachment bar 504. The top edge 612 of attachment extension 108 may be aligned to a delineating groove 614 (one of twenty-eight visible labeled). The spacing 608 between the centerline 610 of holes 124 (one of fifteen labeled) in each crossbar 100 and the attachment centerline 616 aligned to the centers of fastener holes 120 and 122 on each crossbar 100 is predetermined to make spacing 606 correct for mounting full-rack width modules 802 and 804 (See FIG. 8). Top crossbar 100 has the flange 106 extending rearward from the top edge of main bar 102 and bottom crossbar 100 has the flange 106 extending rearward from the bottom edge of main bar 102, for stiffness and ease of installing fasteners.

Figure 7:
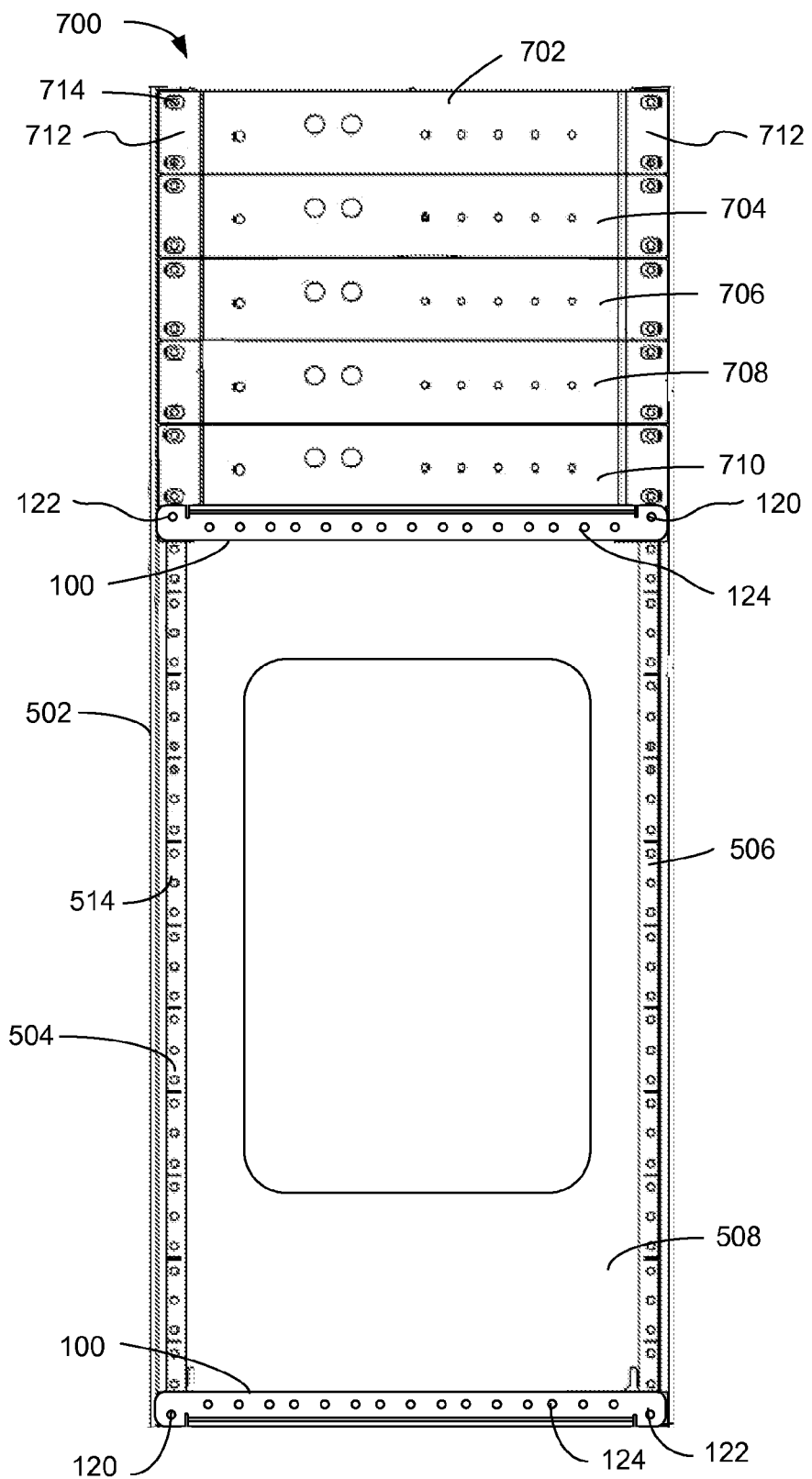
FIG. 7 is a front elevation diagrammatic view illustrating a fourth exemplary embodiment of the half-rack crossbar system, according to a preferred embodiment of the present invention.

FIG. 7 is a front elevation diagrammatic view illustrating a fourth exemplary embodiment of the half-rack crossbar system 700, according to a preferred embodiment of the present invention. FIG. 7 illustrates the use of a plurality of half-rack modules 702, 704, 706, 708, and 710 in tall half-rack 502. Only the internal parts of tall half-rack 502 are shown, for simplicity of illustration. The vertical attachment bars 504 and 506 of tall half-rack 502 are shown, as well as a portion of the rear panel 508. Half-rack module 702 is secured in place by fasteners 714 (one of four labeled) through module flanges 712 into holes, such as hole 514, in vertical attachment bars 504 and 506, respectively. Half-rack modules 704, 706, 708, and 710 are attached by similar means. Upper cross bar 100 is attached by means of fasteners through holes 120 and 122 in upper cross bar 100 and through holes, such as hole 514, in vertical attachment bars 504 and 506, respectively. Lower cross bar 100 is attached by means of fasteners through holes 120 and 122 in lower cross bar 100 and through holes, such as hole 514, in vertical attachment bars 504 and 506, respectively. Crossbars 702 and 704 may be used in any half-rack cabinet of sufficient height, whether wall-mounted or not.

Figure 8:
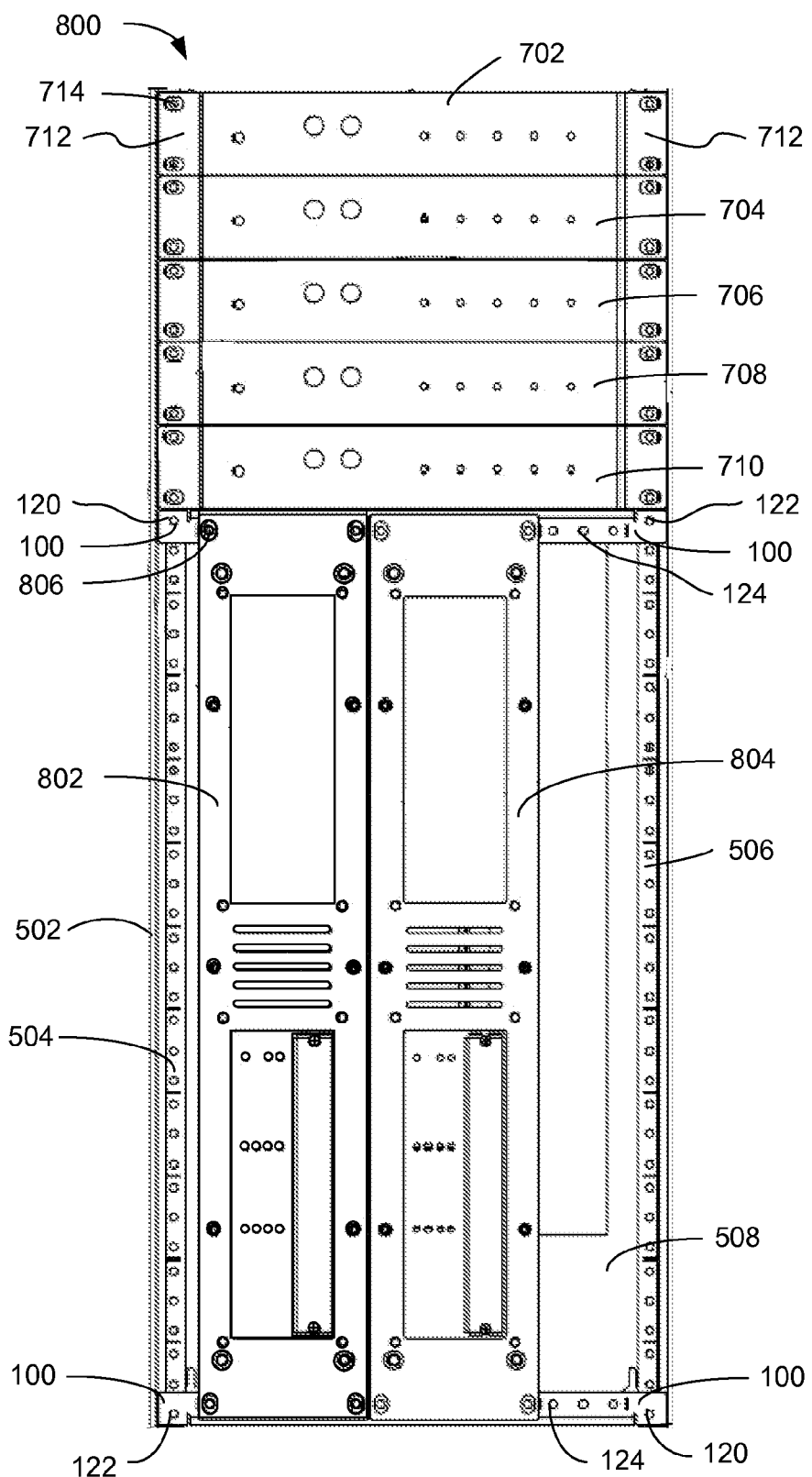
FIG. 8 is a front elevation diagrammatic view illustrating a fifth exemplary embodiment of the half-rack crossbar system, according to a preferred embodiment of the present invention.

FIG. 8 is a front elevation diagrammatic view illustrating a fifth exemplary embodiment of the half-rack crossbar system 800, according to a preferred embodiment of the present invention. First full rack module 802 is vertically mounted by being attached to upper crossbar 100 and lower crossbar 100. Attachment is accomplished using fasteners 806 (one of eight labeled) through holes, such as hole 124, in upper and lower crossbars 100. Second full rack module 804 is vertically mounted by being attached to upper crossbar 100 and lower crossbar 100. Attachment is accomplished using fasteners 806 through holes, such as hole 124, in upper and lower crossbar 100.

Various arrangements of full-rack modules 802 and 804 along with half-rack modules 702, 704, 706, 708, and 710 are contemplated. For example, if the full-rack modules 802 and 804 produce most of the heat in the assembly, they may be put at the top, with the half-rack modules 702, 704, 706, 708, and 710 on the bottom. For another example, the full-rack modules 802 and 804 may be spaced apart horizontally instead of being adjacent, as shown (see FIG. 10). For yet another example, the full-rack modules 802 and 804 may be in the middle, with half-rack modules 702, 704, 706, 708, and 710 above and below (see FIG. 9).

A requirement for half-rack crossbar system 700 is that the tall half-rack 502 be tall enough to accommodate the full-rack and half-rack modules 702, 704, 706, 708, 710, 802, and 804 together. In various additional embodiments, tall half-rack 502 may be sized for more or fewer half-rack modules 702, 704, 706, 708, and 710 and/or for more full-rack modules 802 and 804.

Figure 9:
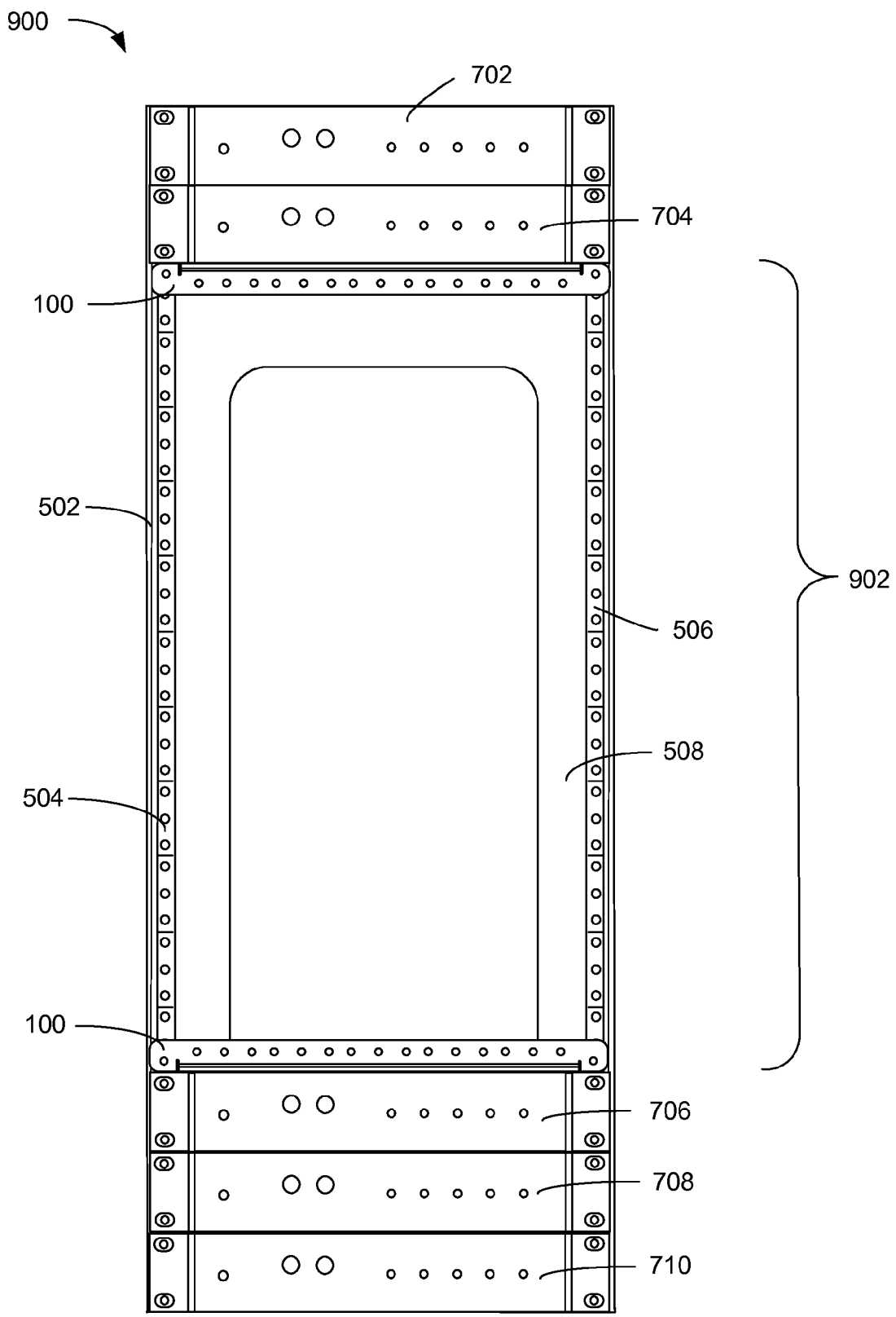
FIG. 9 is a front elevation diagrammatic view illustrating a sixth exemplary embodiment of the half-rack crossbar system, according to a preferred embodiment of the present invention.

FIG. 9 is a front elevation diagrammatic view illustrating a sixth exemplary embodiment of the half-rack crossbar system 900, according to a preferred embodiment of the present invention. With a sufficiently spacious tall half-rack 502, the space 902 for vertically mounting full width modules 802 and 804 may be shifted to any convenient level, as shown. Two half-width modules 702 and 704 are above the full-width module space 902 and three half-width modules 706, 708, and 710 are below the full-width module space 902. There is almost no practical limit on the height to tall half-rack 502, so accommodating multiple full-width module spaces 902 in a particular tall half-rack 502 is contemplated.

Figure 10:
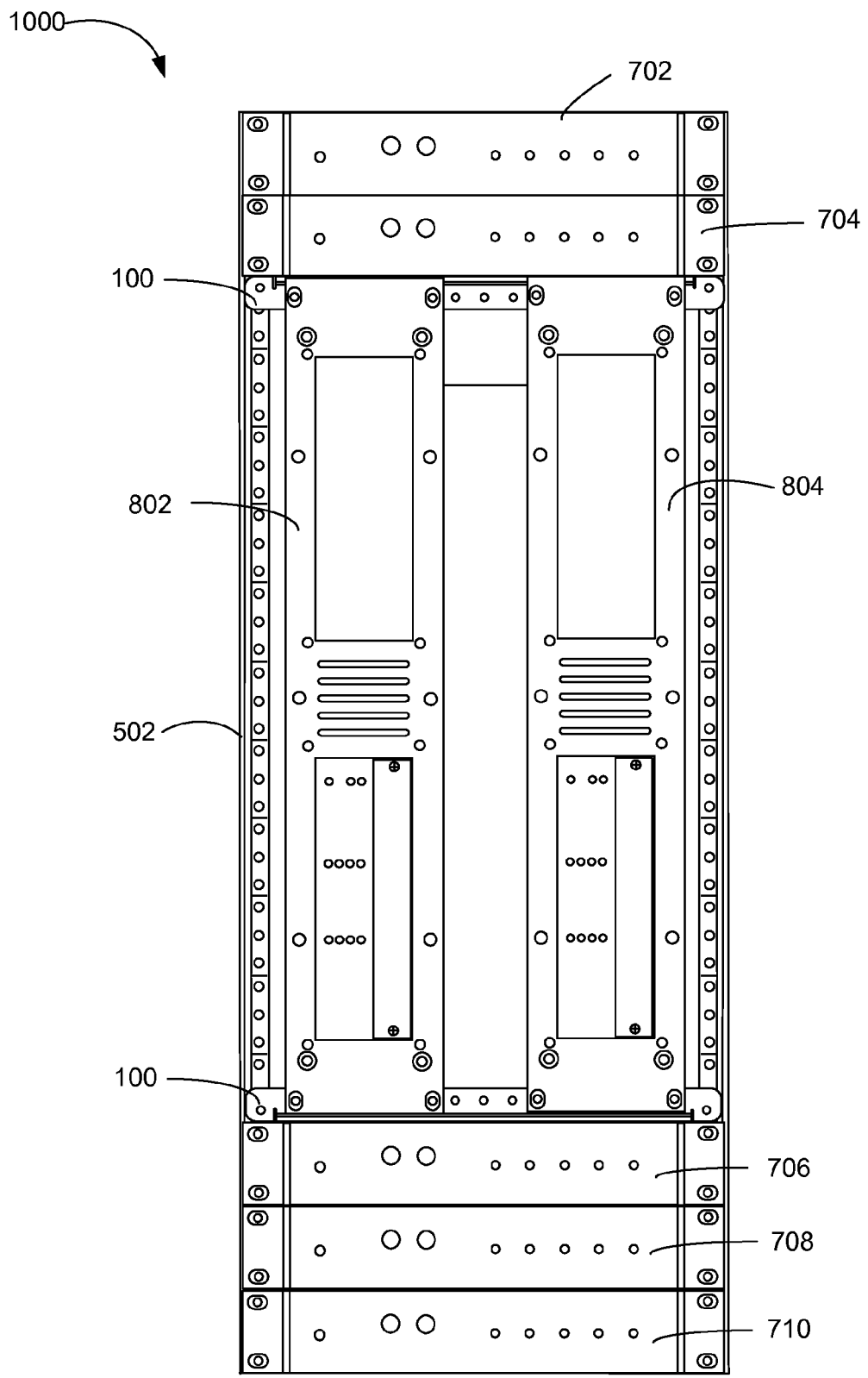
FIG. 10 is a front elevation diagrammatic view illustrating a seventh exemplary embodiment of the half-rack crossbar system, according to a preferred embodiment of the present invention.

FIG. 10 is a front elevation diagrammatic view illustrating a seventh exemplary embodiment of the half-rack crossbar system 1000, according to a preferred embodiment of the present invention. Here, the full-width modules 802 and 804 are mounted vertically but not adjacently. Various arrangements of half-width and full width modules may be used, with important factors being cabling convenience, thermal management, and user convenience.

The embodiments presented herein are exemplary and are not intended to be limiting within the bounds of enablement provided in the specification and the legal boundaries in the claims below. Various substitutions of materials and changes in design that are not dysfunctional for the system claimed are within the scope of the invention.

We claim:

1. A half-rack crossbar system for vertically mounting at least one full width electronics module in a half-width electronics rack, comprising:
   a. a flat elongated main bar having only five sets of three holes in a linear array, wherein said five sets are delineated;
   b. first and second attachment flanges extending from first and second ends, respectively, of said flat elongated main bar; and
   c. first and second holes in said first and second attachment flanges, respectively, wherein said first and second holes are spaced apart to span a distance between parallel holes in first and second opposed attachment bars in said half-width electronics rack.

2. The system of claim 1, comprising first and second notches delineating said first and second attachment flanges, respectively, from said flat elongated main bar.

3. The system of claim 2, wherein said first and second notches extend transversely from a first edge of said flat elongated main bar to a point beyond a centerline between said first and second holes in respective said first and second attachment flanges.

4. The system of claim 2, comprising:
   a. a right-angle bend in a first edge of said flat elongated main bar; and
   b. an elongated flange extending from said bend.

5. The system of claim 4, wherein at least one crossbar comprises said flat elongated main bar, said first and second attachment flanges, said first and second notches, said right-angle bend, and said elongated flange.

6. The system of claim 5, wherein said at least one cross bar comprises a plurality of said crossbars including a first crossbar and a second crossbar of said plurality of crossbars.

7. The system of claim 6, comprising a package enclosing said first crossbar and said second crossbar.

8. The system of claim 6, comprising a tall half-rack, said first crossbar, and said second crossbar, wherein said tall half-rack comprises a half-width electronics rack with sufficient height to accommodate a vertically mounted full-width electronics module.

9. The system of claim 8, comprising a package enclosing said tall half-rack and said first crossbar and said second crossbar.

10. The system of claim 8, comprising said first crossbar and said second crossbar installed in said tall half-rack in an opposed configuration and spaced-apart to accommodate installation of said vertically mounted full-width electronics module.

11. The system of claim 8, comprising said first crossbar and said second crossbar and at least one said vertically-mounted full-width electronics module installed in said tall half-rack.

12. The system of claim 8, comprising said first crossbar and said second crossbar, at least one said vertically-mounted full-width electronics module, and at least one horizontally mounted half-width electronics module installed in said tall half-rack.

13. The system of claim 8, comprising said first crossbar and said second crossbar and at least one horizontally mounted half-width electronics module installed in said tall half-rack.

14. A half-rack crossbar system for vertically mounting at least one full width electronics module in a half-width electronics rack, comprising:
   a. a flat elongated main bar having only five sets of three holes in a linear array wherein said five sets are delineated;
   b. first and second attachment flanges extending from first and second ends, respectively, of said flat elongated main bar;
   c. first and second holes in said first and second attachment flanges, respectively, wherein said first and second holes are spaced apart to span a distance between parallel holes in first and second opposed attachment bars in said half-width electronics rack;

d. first and second notches delineating said first and second attachment flanges, respectively, from said flat elongated main bar; and e. wherein said first and second notches extend transversely inward from a first edge of said flat elongated main bar to a point beyond a centerline between said first and second holes in said first and second attachment flanges.

15. The system of claim 14, comprising:

a. a right-angle bend in said first edge of said flat elongated main bar; and b. an elongated flange extending from said bend.

16. The system of claim 15, wherein at least one crossbar comprises said flat elongated main bar, said first and second attachment flanges, said first and second notches, said right-angle bend, and said elongated flange.

17. The system of claim 16, comprising:

a. wherein said at least one cross bar comprises a plurality of said crossbars including a first said crossbar and a second said crossbar of said plurality of crossbars and at least one of:

b. a package enclosing said first crossbar and said second crossbar;

c. a tall half-rack and said first crossbar and said second crossbar, wherein said tall half-rack comprises a half-width electronics rack with sufficient height to accommodate a vertically mounted full-width electronics module;

d. a package enclosing said tall half-rack and said first crossbar and said second crossbar;

e. said first crossbar and said second crossbar installed in said tall half-rack in an opposed configuration and spaced-apart to accommodate said vertically mounted full-width electronics module;

f. said first crossbar and said second crossbar and at least one vertically-mounted full-width electronics module installed in said tall half-rack;

g. said first crossbar and said second crossbar, at least one vertically-mounted full-width electronics module, and at least one horizontally mounted half-width electronics module installed in said tall half-rack; and h. said first crossbar and said second crossbar and at least one horizontally mounted half-width electronics module installed in said tall half-rack.

18. A half-rack crossbar system for vertically mounting at least one full width electronics module in a half-width electronics rack, comprising:

a. a flat elongated main bar having only five sets of three holes in a linear array wherein said five sets are delineated;

b. first and second attachment flanges extending from first and second ends, respectively, of said flat elongated main bar;

c. first and second holes in said first and second attachment flanges, respectively, wherein said first and second holes are spaced apart to span a distance between parallel holes in first and second opposed attachment bars in said half-width electronics rack;

d. first and second notches delineating said first and second attachment flanges, respectively, from said flat elongated main bar;

e. wherein said first and second notches extend transversely inward from a first edge of said flat elongated main bar to a point beyond a centerline between said first and second holes in said first and second attachment flanges;

f. a right-angle bend in said first edge of said flat elongated main bar; and g. an elongated flange extending from said bend.

19. The system of claim 18, comprises at least one crossbar further comprising said flat elongated main bar, said first and second attachment flanges, said first and second notches, said right-angle bend, and said elongated flange.

20. The system of claim 19, comprising:

a. said at least one cross bar comprising a plurality of said crossbars including a first crossbar and a second crossbar of said plurality of crossbars and at least one of:

b. a package enclosing said first crossbar and said second crossbar;

c. a tall half-rack and said first and second crossbars, wherein said tall half-rack comprises a half-width electronics rack with sufficient height to accommodate a vertically mounted full-width electronics module;

d. a package enclosing said tall half-rack and said first crossbar and said second crossbar;

e. said first crossbar and said second crossbar installed in said tall half-rack in an opposed configuration and spaced-apart to accommodate said vertically mounted full-width electronics module;

f. said first crossbar and said second crossbar and at least one vertically-mounted full-width electronics module installed in said tall half-rack;

g. said first crossbar and said second crossbar, at least one vertically-mounted full-width electronics module, and at least one horizontally mounted half-width electronics module installed in said tall half-rack; and h. said first crossbar and said second crossbar and at least one horizontally mounted half-width electronics module installed in said tall half-rack.

* * * * *